(12) United States Patent
Wheaton

(10) Patent No.: US 8,248,070 B1
(45) Date of Patent: Aug. 21, 2012

(54) MRI USING PREP SCAN SEQUENCE PRODUCING PHASE-OFFSET NMR SIGNALS FROM DIFFERENT NMR SPECIES

(75) Inventor: Andrew J. Wheaton, Shaker Heights, OH (US)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 0 days.

(21) Appl. No.: 13/064,376

(22) Filed: Mar. 22, 2011

(51) Int. Cl.
*G01V 3/00* (2006.01)

(52) U.S. Cl. ...................................................... 324/307

(58) Field of Classification Search .......... 324/300–322; 600/410–435
See application file for complete search history.

(56) References Cited

U.S. PATENT DOCUMENTS

| | | | | |
|---|---|---|---|---|
| 6,275,036 | B1 * | 8/2001 | van Yperen et al. | 324/307 |
| 6,836,114 | B2 * | 12/2004 | Reddy et al. | 324/307 |
| 7,355,405 | B2 * | 4/2008 | Hirata et al. | 324/307 |
| 8,148,981 | B2 * | 4/2012 | Yui | 324/309 |
| 8,159,221 | B2 * | 4/2012 | Yui | 324/307 |

OTHER PUBLICATIONS

W. Dixon, "Simple Proton Spectroscopic Imaging," *Radiology*, vol. 153, No. 1, pp. 189-194 (Oct. 1984).
J. Ma, et al., *Mag. Res. Med.*, vol. 48, "Method for Efficient Fast Spin Echo Dixon Imaging," pp. 1021-1027 (2002).
S. Reeder, et al., *Mag. Res. Med.*, vol. 54, "Iterative Decomposition of Water and Fat With Echo Asymmetry and Least-Squares Estimation (IDEAL): Application With Fast Spin Echo Imaging," pp. 636-644 (2005).
S. Reeder, et al., *Mag. Res. Med.*, vol. 51, "Multicoil Dixon Chemical Species Separation With an Iterative Least-Squares Estimation Method," pp. 35-45 (2004).
W. Lu, et al., *Mag. Res. Med.*, vol. 60, "Water-Fat Separation with Bipolar Multiecho Sequences," pp. 198-209 (2008).
N. Higuchi, et al., *Mag. Res. Med.*, vol. 27, "A Novel Method for Fat Suppression in RARE Sequences," pp. 107-117 (1992).
G. Glover, et al., *Mag. Res. Med.*, vol. 18, "Three-Point Dixon Technique for True Water/Fat Decomposition With $B_0$ Inhomogeneity Correction," pp. 371-383 (1991).
J. Szumowski, et al., *Mag. Res. Med.*, vol. 9, "Notes: Hybrid Methods of Chemical-Shift Imaging," pp. 379-388 (1989).
T. Chan, et al., *Radiology*, vol. 181, "Combined Chemical-Shift and Phase-Selective Imaging for Fat Suppression: Theory and Initial Clinical Experience," pp. 41-47 (Oct. 1991).
J. Mao, et al., *Mag. Res. Imaging*, vol. 11, "Fat Tissue and Fat Suppression," pp. 385-393 (1993).
Q. Xiang, et al., *J Mag. Res. Imaging*, vol. 7, No. 6, "Water-Fat Imaging With Direct Phase Encoding," pp. 1002-1015 (1997).
F. Schick, et al., *Mag. Res. Med.*, vol. 38, "Highly Selective Water and Fat Imaging Applying Multislice Sequences Without Sensitivity to $B_1$ Field Inhomogeneities," pp. 269-274 (1997).

(Continued)

*Primary Examiner* — Dixomara Vargas
(74) *Attorney, Agent, or Firm* — Nixon & Vanderhye PC

(57) ABSTRACT

A magnetic resonance imaging (MRI) process generates images of patient tissue including use of at least one programmed controller in an MRI system to effect a preparatory nuclear magnetic resonance (NMR) sequence including a binomial radio frequency (RF) pulse having at least two independently phased RF flip angle components that are spaced in the time domain by τ to provide a respectively corresponding evolved phase difference Δθ between predetermined NMR species having different NMR frequencies, followed by a main MRI data acquisition sequence, and generation and display of an image of patient tissue based at least in part on MRI data acquired during the acquisition sequence.

20 Claims, 5 Drawing Sheets

OTHER PUBLICATIONS

J. Berglund, et al., *Mag. Res. Med.*, vol. 65, "Two-Point Dixon Method With Flexible Echo Times," pp. 994-1004 (2011).

H. Eggers, et al., *Mag. Res. Med.*, vol. 65, "Dual-Echo Dixon Imaging With Flexible Choice of Echo Times," pp. 96-107 (2011).

H. Yu, et al., *Mag. Res. Med.*, vol. 55, "Single Acquisition Water-Fat Separation: Feasibility Study for Dynamic Imaging," pp. 413-422 (2006).

Chen, et al., *Radiology*, vol. 252, No. 2, "Multiecho IDEAL Gradient-Echo Water-Fat Separation for Rapid Assessment of Cartilage vol. at 1.5 T: Initial Experience," pp. 561-567 (Aug. 2009).

Z. Wen, et al., *Med. Phys.*, vol. 35, No. 8, "Noise Considerations of Three-Point Water-Fat Separation Imaging Methods," pp. 3597-3606 (Aug. 2008).

Hernando, et al., *Mag. Res. Med.*, vol. 65, "Removal of Olefinic Fat Chemical Shift Artifact in Diffusion MRI," pp. 692-701 (2011).

T. Bley, et al., *J. Mag. Res. Imaging*, vol. 31, "Fat and Water Magnetic Resonance Imaging," pp. 4-18 (2010).

C. Meyer, et al., *Mag. Res. Med.*, vol. 15, "Simultaneous Spatial and Spectral Selective Excitation," pp. 287-304 (1990).

G. Glover, *J. Mag. Res. Imaging*, vol. 1, No. 5, "Multipoint Dixon Technique for Water and Fat Proton and Susceptibility Imaging," pp. 521-530 (Sep./Oct. 1991).

P. Hardy, et al., *J. Mag. Res. Imaging*, vol. 5, No. 2, "Separation of Fat and Water in Fast Spin-Echo MR Imaging with the Three-Point Dixon Technique," pp. 181-185 (Mar./Apr. 1995).

W. Lu, et al., *Proc. Intl. Soc. Mag. Reson. Med.*, vol. 15, "Multi-Resolution Non-Iterative Field Map Estimation for Water and Fat Separation," p. 1638 (2007).

F. Schick, *Mag. Res. Med.*, vol. 40, "Simultaneous Highly Selective MR Water and Fat Imaging Using a Simple New Type of Spectral-Spatial Excitation," pp. 194-202 (1998).

\* cited by examiner

MRI USING PREP SCAN SEQUENCE PRODUCING PHASE-OFFSET NMR SIGNALS FROM DIFFERENT NMR SPECIES

FIELD

The subject matter below relates generally to magnetic resonance imaging (MRI) processes and apparatus. Preferably, the MRI processes and apparatus described below involve enhancements to separation of nuclear magnetic resonance (NMR) signals emanating from different NMR species (e.g., water molecules and fat molecules).

DETAILED DESCRIPTION

Figure 1:
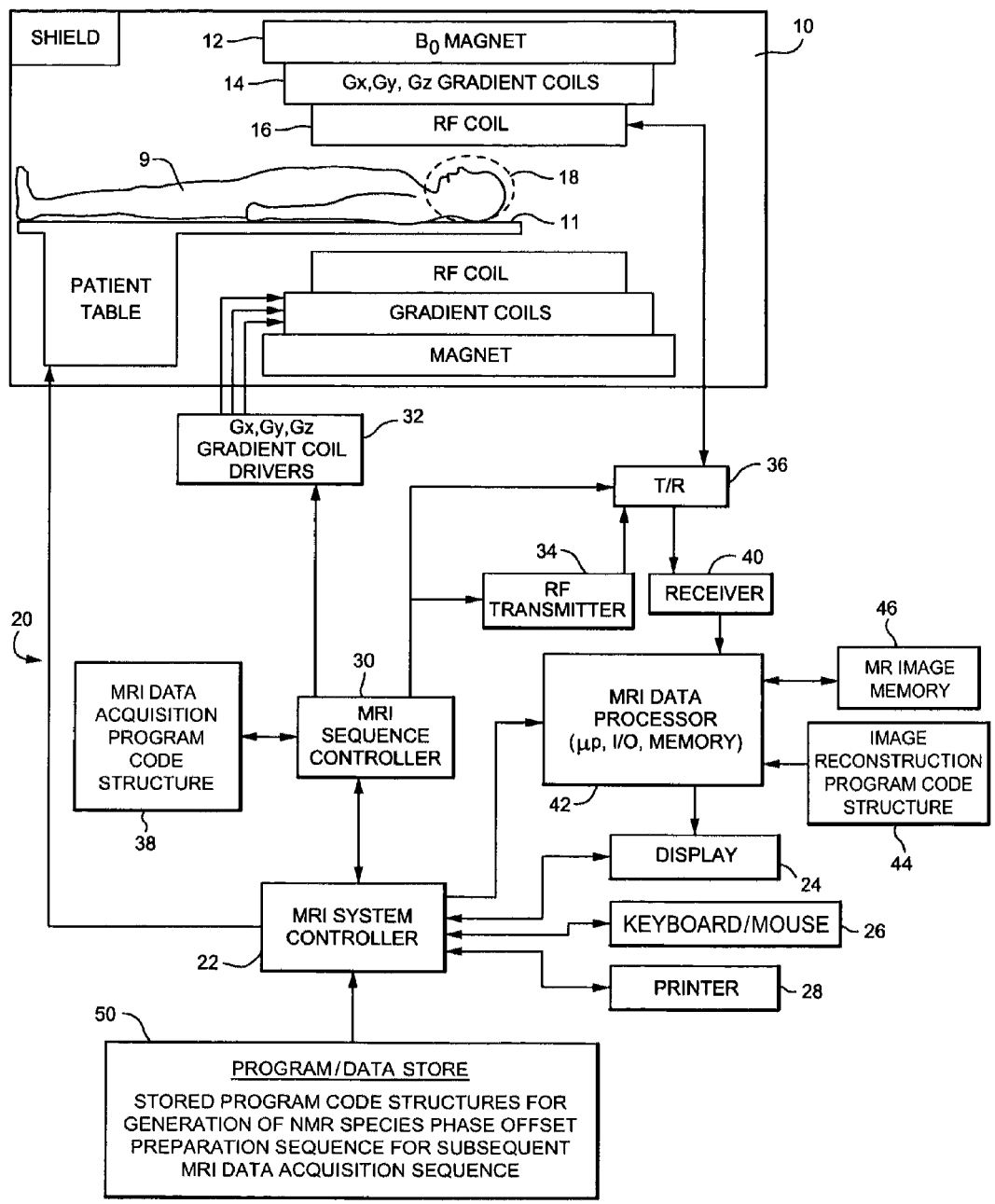
FIG. 1 is a high-level schematic block diagram of an exemplary MRI system embodiment using an enhanced NMR species separation (e.g., water and fat) preparatory pulse sequence (i.e., prior to a main MRI data acquisition sequence)

The MRI system shown in FIG. 1 includes a gantry 10 (shown in schematic cross-section) and various related system components 20 interfaced therewith. At least the gantry 10 is typically located in a shielded room. One MRI system geometry depicted in FIG. 1 includes a substantially coaxial cylindrical arrangement of the static field B0 magnet 12, a $G_x$, $G_y$ and $G_z$ gradient coil set 14 and an RF coil assembly 16. Along the horizontal axis of this cylindrical array of elements is an imaging volume 18 shown as substantially encompassing the head of a patient 9 supported by a patient table 11.

An MRI system controller 22 has input/output ports connected to display 24, keyboard/mouse 26 and printer 28. As will be appreciated, the display 24 may be of the touch-screen variety so that it provides control inputs as well.

The MRI system controller 22 interfaces with MRI sequence controller 30 which, in turn, controls the $G_x$, $G_y$ and $G_z$ gradient coil drivers 32, as well as the RF transmitter 34 and the transmit/receive switch 36 (if the same RF coil is used for both transmission and reception). The MRI sequence controller 30 also has access to suitable program code structure 38 for implementing MRI data acquisition sequences already available in the repertoire of the MRI sequence controller 30 using operator and/or system inputs defining particular sequence parameters.

The MRI system 20 includes an RF receiver 40 providing input to data processor 42 so as to create processed image data to display 24. The MRI data processor 42 is also configured for access to image reconstruction program code structure 44 and to MR image memory 46 (e.g., for storing MR image data derived from processing in accordance with the exemplary embodiments and the image reconstruction program code structure 44).

Also illustrated in FIG. 1 is a generalized depiction of an MRI system program/data store 50 where stored program code structures (e.g., for generation of an enhanced preparatory sequence such as a water/fat opposed phase sequence using a binomial RF chemical shift selective preparation pulse) are stored in computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments to be described hereinbelow. The system components can be divided into different logical collections of "boxes" that typically comprise numerous digital signal processors (DSP), microprocessors, special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an MR-imaging reconstruction process, an array of computer-readable accessible data value storage sites (e.g., multi-digit binary representations of pixel values) in physical storage media will be transformed from some prior state (e.g., all uniform "zero" values or all "one" values) to a new state wherein the physical states at the physical sites of such an array (e.g., of pixel values) vary between minimum and maximum values to represent real world physical events and conditions (e.g., the tissues of a patient over an imaged volume space). As those in the art will appreciate, such arrays of stored data values represent and also constitute a physical structure—as does a particular structure of computer control program codes that, when sequentially loaded into instruction registers and executed by one or more CPUs of the MRI system 20, cause a particular sequence of operational states to occur and be transitioned through within the MRI system.

The exemplary embodiments described below provide improved ways to acquire and/or process MRI data acquisitions and/or to generate and display MR images.

Standard Dixon-based techniques have been used for fat suppression for over twenty years. In the spin echo (SE) form of Dixon, the RF refocus pulse is shifted in time so that fat and water achieve a desired relative phase at the TE (time to echo), preferably π radians out-of-phase. The spin echo (SE) form of Dixon can be extended to fast spin echo (FSE). In the FSE version, the Dixon effect is achieved by time shifting corresponding to the desired out-of-phase time either the position of the first RF refocus pulse or the position of the read echo time ($k_x=0$) within the echo signal. The RF refocus pulse shift approach has the primary disadvantage of alternating the $k_x$ position of the RF echo in each view, resulting in classic N/2 ghosting. The other approach of shifting the position of the read echo within the echo space either extends inter-echo spacing by a full cycle time (4.6 ms at 1.5 T and 2.3 ms at 3 T) or forces asymmetric echo acquisition.

In Dixon-SE and Dixon-FSE, the RF echo and read echo ($k_x=0$) are not acquired at the same time. Thus, there is some background phase accrual during this delay. To allow water/fat separation, this background phase must be removed with an estimation of the field map. The estimation of the background phase is non-trivial. As a further drawback to conventional Dixon-FSE with echo spacing extension, long echo spacings are known to impair robustness of the field map estimation.

If multiple Dixon-FSE images are acquired for water/fat separation, the read echo is acquired at a different temporal position within the echo spacing in each image. With this arrangement, each echo is acquired with slightly different phase due to time-dependent sources of phase (i.e., eddy currents from preceding gradients). Therefore, special considerations must be taken to address this phase which, unlike the background phase that can be accounted for, is non-uniform across the data sets.

So-called "binomial" NMR RF excitation pulses have previously been used for spectral-selective (e.g., water) excitation. For example, binomial pulses having plural RF nutation components in nutation angle ratios such as 1:1, 1:2:1, 1:3:3:1, etc., have been used to selectively nutate NMR water-related magnetization into a transverse plane, while leaving magnetization emanating from fat molecules in the longitudinal axis aligned with the static magnetic field $B_0$, thus creating a fat-suppressed image.

Hereinbelow, exemplary embodiments provide a preparatory NMR sequence using a binomial radio frequency (RF) pulse having at least two independently phased RF flip angle components, the components being spaced in the time domain by τ to provide a respectively corresponding evolved phase difference Δθ between predetermined NMR species which have different NMR frequencies. Such binomial RF pulses are then followed by at least one magnetic gradient spoiler pulse before a conventional main MRI data acquisition sequence is effected. The MRI data acquired during such conventional sequence may then be used conventionally to generate and display an image of the patient's tissue based, at least in part, on the acquired MRI data.

In a particularly preferred exemplary embodiment, the RF flip angle components each provide a substantially 90° ($\pi/2$ radians) nutation flip angle and have a relative RF phase difference of substantially 180° π radians. Furthermore, in this exemplary embodiment, the evolved phase difference between different species is substantially π—and the chemical phase shift separated NMR species are water and fat species separated by about 3.4 ppm (parts per million) in the frequency domain.

As will be explained in more detail, the prep scan/MRI data acquisition process may be repeated with differing prep scan parameters (e.g., phase cycling of the relative RF phase used for at least one of the binomial pulse components) followed by combining of the plural sets of acquired MRI data to provide a more uniform signal across a spectrum of off-resonance NMR signals and thus a more uniform final image (e.g., by using a sum of squares (SSQ) or maximum intensity projection (MIP) or the like data combination processes).

A conventional MRI data acquisition sequence following the special preparatory NMR sequence may include for example, a fast spin echo (FSE), a single shot fast spin echo (SSFSE), a fast asymmetric spin echo (FASE), a variable flip angle (VFA) or a steady-state free precession (SSFP) data acquisition sequence—or any other desired MRI data acquisition sequence.

The exemplary embodiments create Dixon images using a unique prepulse. The exemplary embodiments can create Dixon water/fat opposed-phase (WFOP) fat-suppressed images. In a more sophisticated scheme, the prepulse can be used to generate fat/water separation images (similar to LAVA (Liver Acquisition with Volume Acquisition), IDEAL (Iterative Decomposition of water and fat with Echo Asymmetry and Least squares estimation), etc.).

The WFOP and fat/water separation images can be acquired without imposing restrictions on the subsequent main MRI data acquisition pulse sequence timing including TE/TR, inter-echo spacing, or readout bandwidth. For these reasons, the primary application of the exemplary embodiments is likely to generate fat/water separation images using aggressive readout methods including short echo space FSE (FASE or VFA) or SSFP imaging.

Figure 2:
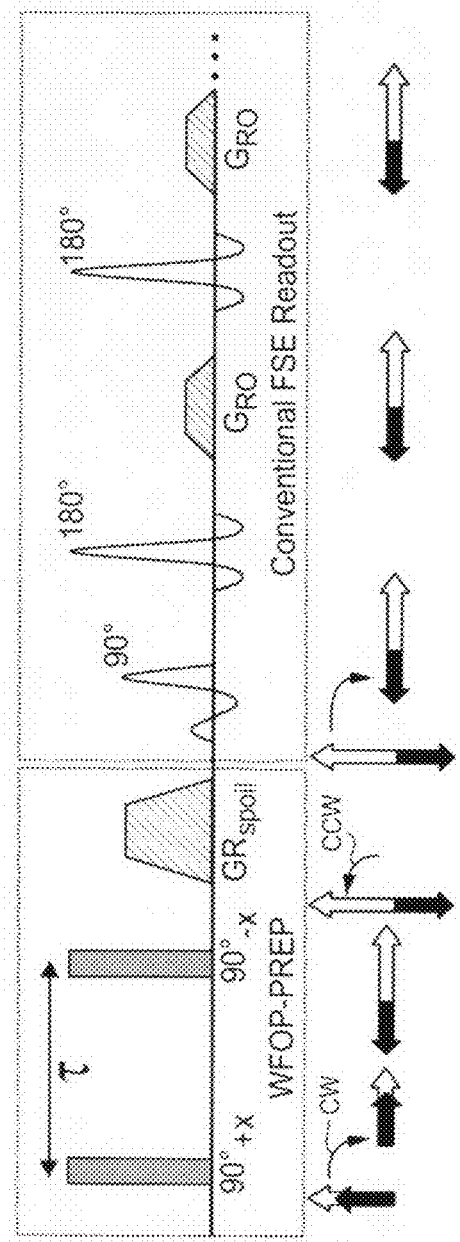
FIG. 2 is an abbreviated schematic sequence diagram for an exemplary water/fat opposed-phase (WFOP) preparatory sequence followed by a conventional FSE (fast spin echo) MRI pulse sequence.

The exemplary WFOP-prep sequence of FIG. 2 consists of a binomial RF nutation pulse having two 90° flip pulse components. The 90° RF components can be made non-selective or slice/slab-selective. The relative transmit phase of the RF pulse components is a design parameter which affects water/fat phase evolution. In the simplest exemplary scheme, the transmit phase of the RF flip components is opposite (+x, −x, e.g., +90°, −90°).

The exemplary WFOP-prep sequence of FIG. 2 is attached to a conventional FSE readout main MRI data acquisition sequence. The inter-pulse phase evolution time τ is preferably 1.15 ms at 3 T for water/fat separation. The evolution of fat (solid arrow) and water (open arrow) isochromats during the sequence is displayed with schematic 90° clockwise (CW) and 90° counterclockwise (CCW) flip angles depicted corresponding to relative RF component phasing of 180° (e.g., $x=\pi/2$). Although the RF pulses can be made slice- or slab-selective, in this diagram they are illustrated as non-selective pulses.

The exemplary RF components are separated by an out-of-phase time period (1.15 ms at 3 T for water/fat separation). The first pulse nutates longitudinal magnetization into the transverse plane. The relative phase angle between fat and water evolves during the inter-pulse period τ. After a freely adjustable time τ (preferably equal to 1.15 ms for opposed water/phase phase separation), the transverse magnetization is reversely nutated back into the longitudinal axis, thereby storing the evolved phase angle between fat and water. The opposed-phase longitudinal magnetization is then read using any conventional MRI readout sequence, without the need for pulse/echo shifting or readout adjustment. In the case of FSE, the refocus pulse(s) of the echo train realign the transverse magnetization with its original relative phase (fat/water opposed) at each echo.

The exemplary WFOP-prep sequence uses a binomial (1:1) RF composite pulse, which is somewhat similar to prior use for spectral-selective excitation. However, the new exemplary WFOP-prep sequence is designed to leave both vectors (fat and water) in the longitudinal axis. In conventional binomial spectral-selective excitation, one species vector is put into the transverse plane (generally water) and the other species vector is left in the longitudinal axis (generally fat). In this way, WFOP-prep resembles a binomial spectral-selective inversion pulse as opposed to a binomial spectral-selective excitation pulse. With WFOP-prep, one vector is selectively inverted as opposed to one vector being selectively excited.

The WFOP-prep prepulse can be used to generate simple Dixon images. The most common use for this exemplary embodiment is simple fat suppression using WFOP-prep with $\tau=\pi$ it to provide some fat cancellation. However, multiple WFOP-prep images with different phase evolution periods ($\tau$) can be combined to generate fat/water separation images.

Since $\tau$ is a free parameter, WFOP-prep can be used as part of a multi-point Dixon method fat/water separation. With WFOP-prep, multiple image sets can be acquired with different $\tau$. Since the relative evolved phase angle is developed as part of the prep sequence, and not the MRI acquisition and readout sequence, the data at each $\tau$ time is acquired with identical contributions from other sequence-dependent sources of phase (i.e., eddy currents) and stimulated echo signal. This uniformity in all data sets can help simplify analysis of the resulting multi-point Dixon data.

The brain of a male volunteer was scanned on a 3 T whole-body research system under IRB approval Axial partial-Fourier 3D FSE with and without WFOP-preparation were acquired with the following parameters: TE/TR=80/3000 ms, echo space=5.0 ms, 2 shots, ETL=80, matrix=256×256, partial-Fourier factor=⅝, FOV=25×25 cm, sixteen 3 mm thick slices and readout BW=651 Hz/pixel. For comparison, analogous images with CHESS (chemical shift selective) fat saturation were acquired.

To measure the fat suppression effect, ROIs (regions of interest) were placed at four locations in the fat region under the scalp, four locations in white matter (WM), and four locations in gray matter (GM).

Figure 3:
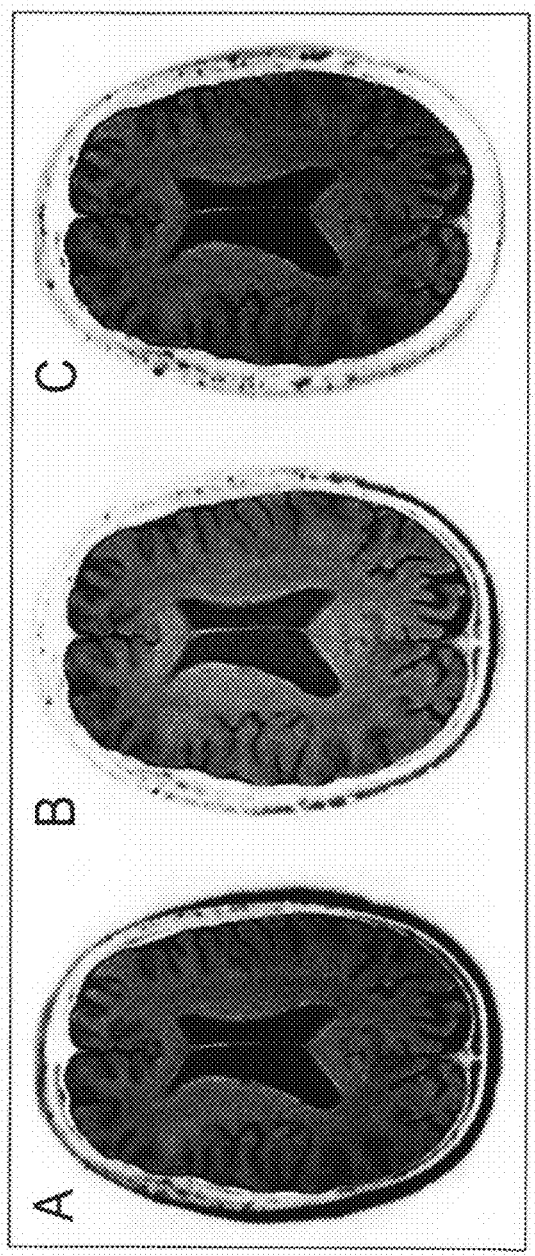
FIG. 3 includes three comparative MR images of brain tissue.

Representative images without fat saturation (A) and with WFOP-prep (B) or CHESS fat saturation (C) are displayed in FIG. 3. The WFOP-prep (B) removed most of the fat signal without deleteriously affecting water signal.

While this simple single image feasibility study image 3(B) is not as good as the CHESS image 3(C), multiple images combined will improve that and, unlike with CHESS, one can obtain true water-only and fat-only images using the exemplary WFOP-prep scan.

The WFOP-prep sequence enabled Dixon image acquisition with a conventional short echo space FSE readout. The choice of echo spacing, readout bandwidth and other sequence parameters can be made independently of the $\tau$ time. This freedom allows FSE-based Dixon methods to be used in conjunction with applications with short echo-spacing, such as single-shot FSE.

Figure 4:
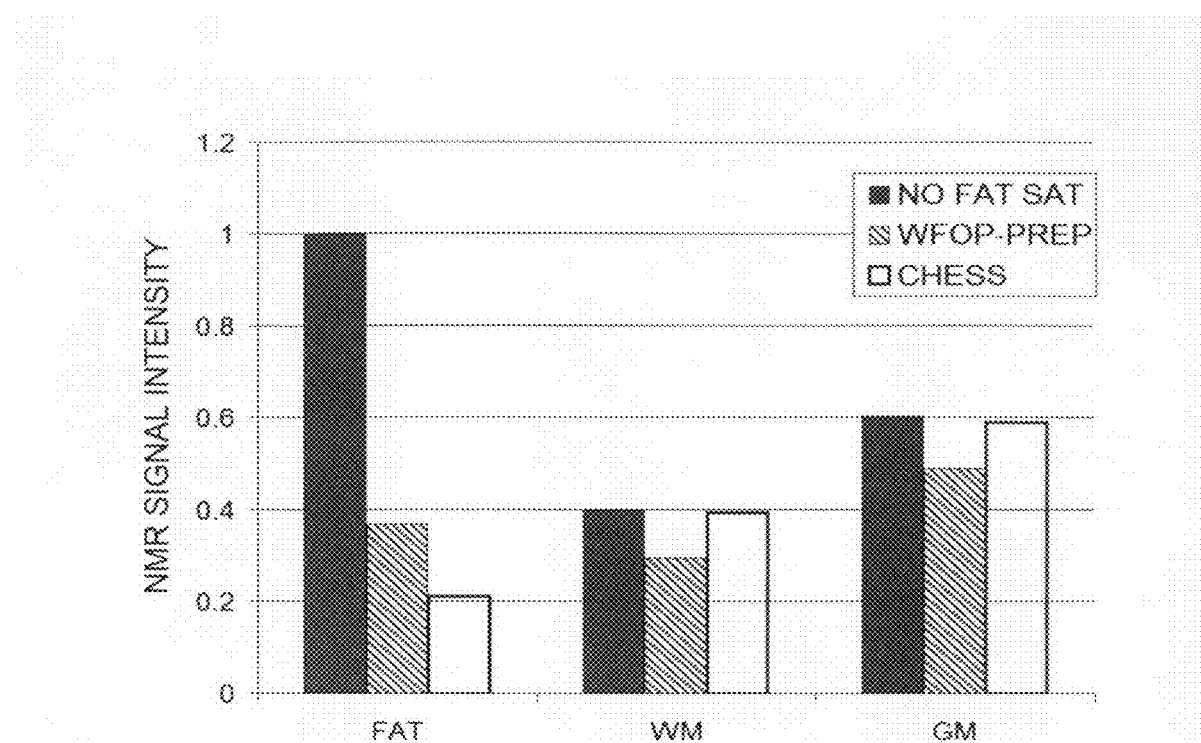
FIG. 4 is a normalized bar graph comparison of fat, white matter and gray matter in three comparative MR images.

When used as a part of a single acquisition, the WFOP-prep sequence is vulnerable to signal loss as evidenced by the 20-25% decrease in WM and GM signals shown in FIG. 4. FIG. 4 shows signal comparison of non-fatsat, WFOP-prep and CHESS images. Data were normalized to the fat signal in the non-fat sat image. The fat signals of WFOP and CHESS were decreased by 63% and 79%, respectively. WFOP-prep had 25% and 19% decreases in WM and GM signals, respectively. The CHESS data had negligible decrease in water signal. Signal loss can come from an imperfect 90° due to $\Delta B_1$ RF field inhomogeneity and phase accrual caused by background $\Delta B_0$ static field inhomogeneity during the $\tau$ free evolution time. For these reasons, WFOP-prep in a single acquisition may be applicable only in regions with adequate $B_0$ and $B_1$ homogeneity. The signal loss due to background phase accrual is sinusoidal. It can be relieved as described below.

The relative transmit RF phase of the WFOP-prep sequence RF components can be alternated to "phase-cycle" the WFOP-prep data. This phase-cycling is similar in concept and design to SSFP (i.e., CISS (Constructive Interference Steady-State)).

Figure 5:
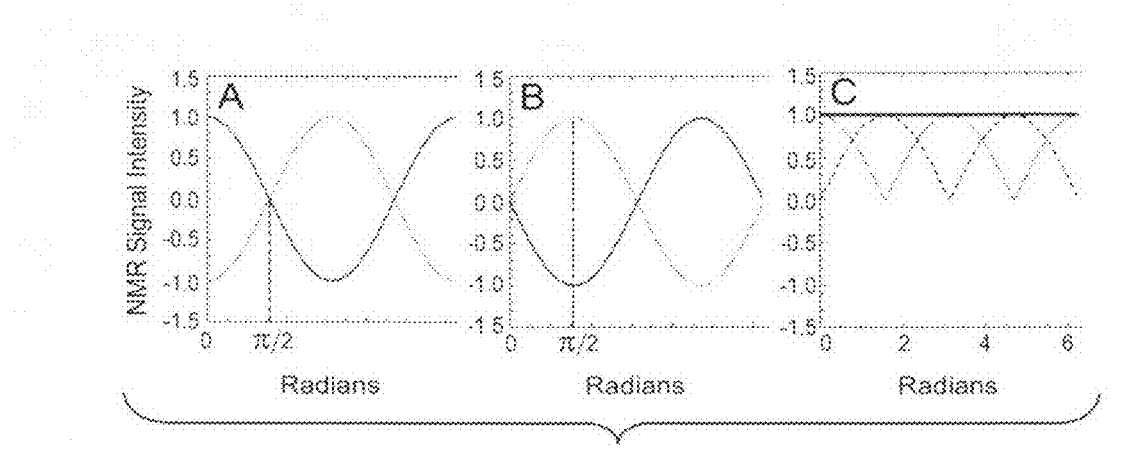
FIG. 5 depicts NMR signal intensities in an exemplary embodiment using a phase-cycling preparatory sequence scheme followed by data combination from multiple such acquisitions (using sum of squares (SSQ) in this example) to create a resultant final image with full signal across an entire spectrum of off-resonance NMR signals.

For example, a first WFOP-prep acquisition can use: $90_{+x}$-($\pi$ time delay)-$90_{-x}$. At $\pi/2$ off-resonance (equivalent to 110 Hz at 3 T), the signals from both fat and water disappear as seen in FIG. 5A. However, an additional WFOP-prep sequence can be acquired using $90_{+x}$-($\pi$ time delay)-$90_{+y}$. In this second acquisition, on-resonant spins (fat and water) will also disappear, but the $\pi/2$ off-resonant spins will be at full signal as shown in FIG. 5B.

The images from each of these data sets can be combined (using MIP, SSQ, etc.) to create a final image with a more uniform signal across the spectrum of off-resonances as depicted in FIG. 5C where the dashed line represents squared data from FIG. 5B, the dotted line represents squared data from FIG. 5A, and the solid line represents the combination of the dotted and dashed lines. In this way, the final image will closely resemble a CISS image, where two SSFP images are combined to create a more uniform final image (i.e., with full signal strength across a spectrum of off-resonance nuclei).

Figure 6:
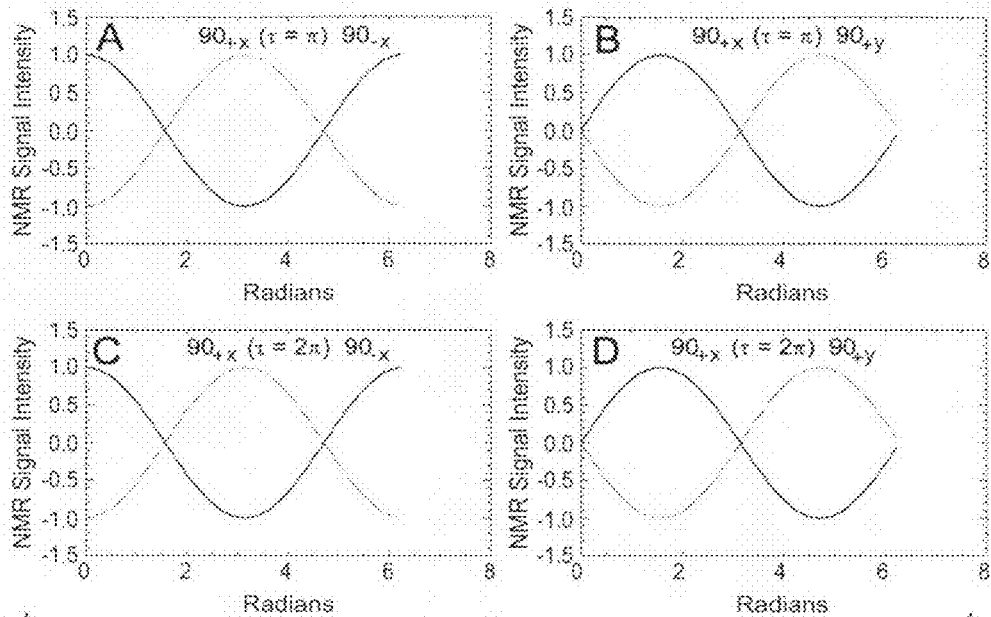
FIG. 6 depicts four NMR signal acquisitions in another phase-cycling scheme to provide four input images for data combinations.

FIG. 6 also depicts another example of sinusoidal signal modulation which causes signal loss at zero-crossings. As explained, to compensate for this signal loss, the relative transmit phase of the RF pulses can be adjusted. For example, a transmit phase scheme of $90_{+x}$-$90_{+y}$ (FIGS. 6B and 6D) produces peaks where the $90_{+x}$-$90_{-x}$ scheme (FIGS. 6A and 6C) produces troughs. Thus, a shift of $\pi/2$ in RF transmit phase is equivalent to a $\pi/2$ shift in the sinusoidal response.

In a simple Dixon opposed-phase image acquisition, only a single image must be acquired (e.g., using the scheme presented in FIG. 6A). However, due to this signal modulation, an additional phase cycled image can be acquired (using the scheme in FIG. 6B) and the resulting data combined (e.g., using SSQ, MIP, etc.) to create a final Dixon opposed-phase image substantially without signal loss.

For fat/water separation, it is necessary to acquire multiple images at different $\pi$ phase separation times. For any Dixon-based method, including WFOP-prep, the minimum number of individual images is two. For example, these two images acquired with $\tau=\pi$ and $\tau=2\pi$, correspond to FIGS. 6A and 6C. However, due to the sinusoidal signal modulation, acquisition of additional images is recommended. Most importantly, the transmit phase cycled $\tau=\pi$ image (corresponding to FIG. 6B) should be acquired. For additional robustness, the transmit phase cycled $\tau=2\pi$ image (corresponding to FIG. 6D) can also be acquired.

In FIG. 6: (A) Water (solid line) and fat (dotted line) signals using $\tau=\pi(1.15$ ms) evolution period across $\pi$ spectrum of off-resonance for $90_{+x}$-$90_{-x}$ scheme where, at $\pi/2$ off-resonance, the signals disappear; (B) with transmit phase scheme ($90_{+x}$-$90_{+y}$) and $\tau=\pi$, the signal responses of fat and water are shifted and now, at $\pi/2$ off-resonance, fat and water are at full signals (still with opposite phases); (C) transmit phase scheme ($90_{+x}$-$90_{-x}$) and $\tau=2\pi$, fat and water are aligned, but continue to cycle due to off-resonance; and (D) transmit phase scheme ($90_{+x}$-$90_{+y}$) and $\tau=2\pi$ where, again, fat and water are aligned.

The images (hereby referred to as A, B, C and D corresponding to their $\tau$ times and transmit phase schemes in FIG. 6) can be input into a linear system to solve for the water and fat components. The simplified equations for the data sets can be written as below using $\rho_w$ for water spin density, $\rho_f$ for fat spin density, and $\phi$ for background phase (equivalent to $\Delta B_0$).

$$A = (\rho_w - \rho_f) \cdot \cos\phi$$

$$B = (\rho_w - \rho_f) \cdot \sin\phi$$

$$C = (\rho_w + \rho_f) \cdot \cos 2\phi$$

$$D = (\rho_w + \rho_f) \cdot \sin 2\phi \qquad \text{(Equations 1)}$$

The input data for A, B, C and D only needs to be signed magnitude data, not complex data. With this information, a simple phase map can be derived using B and A (alternatively, D and C). It is noted that phase unwrapping is not necessary. Since this does not operate on complex image data, only signed magnitude, the absolute phase is irrelevant, and only the relative phase is relevant. Alternatively, an external phase map (e.g., from shimming data acquisition) can be used or the phase map can be solved iteratively (like in IDEAL).

$$\tan^{-1}\left(\frac{C}{A}\right) = \tan^{-1}\left(\frac{(\rho_w - \rho_f)\cdot\sin\phi}{(\rho_w - \rho_f)\cdot\cos\phi}\right) = \tan^{-1}\left(\frac{\sin\phi}{\cos\phi}\right) \qquad \text{(Equation 2)}$$

Using the solution for $\phi$, Equations 1 can be rewritten in matrix format as shown below (Equations 3) and solved using linear algebra methods to find $\rho_w$ and $\rho_f$. In this example, singular value decomposition (SVD) has been chosen as the method to invert the $\phi$ matrix, but there are other available numerical methods as will be appreciated.

$$\begin{bmatrix} A \\ C \\ B \\ D \end{bmatrix} = \begin{bmatrix} \cos\phi & -\cos\phi \\ \cos 2\phi & \cos 2\phi \\ \sin\phi & -\sin\phi \\ \sin 2\phi & \sin 2\phi \end{bmatrix} \begin{bmatrix} \rho_w \\ \rho_f \end{bmatrix} \qquad \text{(Equation 3)}$$

$$\begin{bmatrix} \rho_w \\ \rho_f \end{bmatrix} = \begin{bmatrix} \cos\phi & -\cos\phi \\ \cos 2\phi & \cos 2\phi \\ \sin\phi & -\sin\phi \\ \sin 2\phi & \sin 2\phi \end{bmatrix}^{-1} \begin{bmatrix} A \\ C \\ B \\ D \end{bmatrix}$$

The above equations have been constructed for a four input image case. Of course, more images can be acquired with different τ and/or relative transmit phase and added to the matrix. The minimum number of images is two. The ideal number of input images is a function of the amount of background phase and SNR (signal-to-noise ratio).

Figure 7:
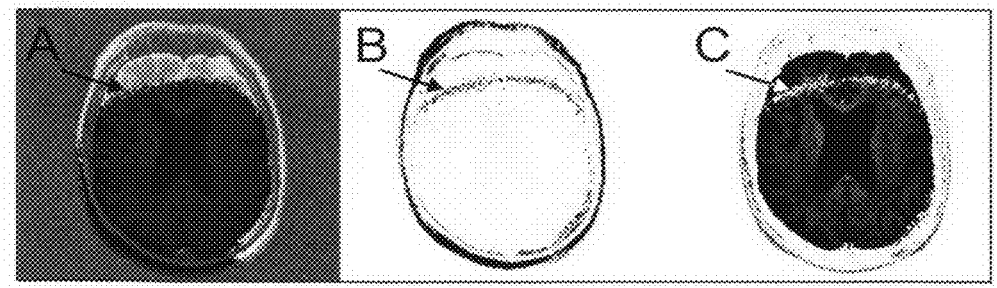
FIG. 7 provides three comparative MR images demonstrating incorrect fat/water assignment near signal polarity crossings.

Using the above solution will produce an estimate of $\rho_w$ and $\rho_f$ at each pixel location. However, the result is sensitive to the polarity of the input signed magnitude reconstruction. At the junction between positive and negative polarities, the assignment between fat and water can be incorrect for some pixels. An example of this problem is illustrated in FIG. 7. Here, an example of incorrect fat/water assignment is shown near the polarity crossing (arrows): (A) input signed magnitude image where gray=0, bright=first polarity, dark=opposite polarity, and using this input data produces fat (B) and water (C) images with incorrect pixel assignment near the polarity crossing shown in (A).

One method to alleviate this sensitivity is to generate a high quality, robust, signed magnitude reconstruction, for which there are many methods published in the literature. Most methods are dependent on good SNR of the input data and/or require a well-behaved phase map with slowly spatially varying phases.

However, for this exemplary embodiment, there is no need to be concerned with the signed magnitude data itself, but rather the final water and fat separation images. Therefore, a simple and robust solution can be effected to remove sensitivity to polarity in the signed magnitude images.

Figure 8:
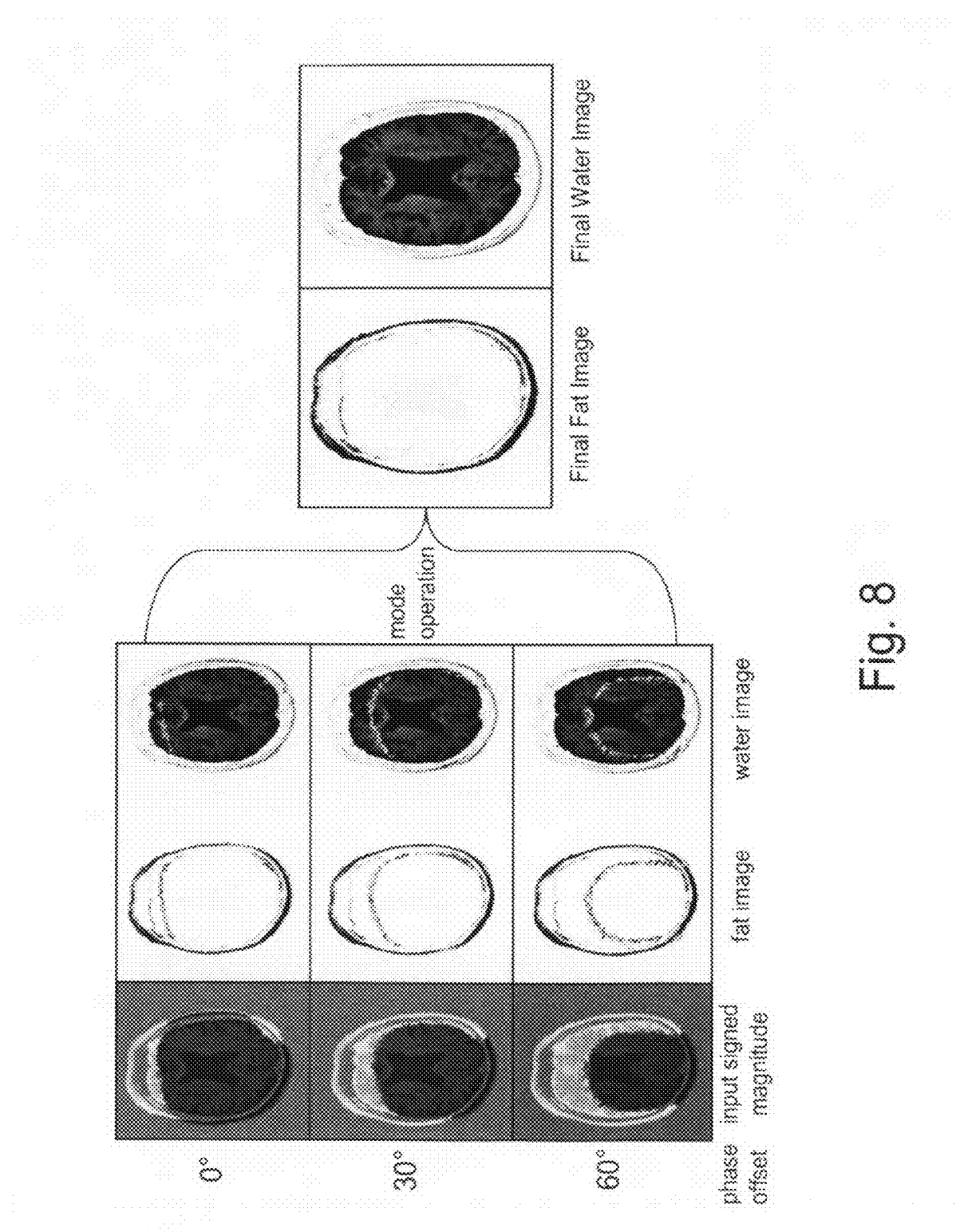
FIG. 8 provides exemplary MR images for an example of fat/water image processing using multiple phase offsets.

For example, fat/water separation can be effected using phase offsets. For each input image data set, the simple magnitude and phase (θ) images are generated as shown in FIG. 8. Using the phase image, a positive polarity is assigned for each pixel with $\theta \geq 0$ and negative polarity to each pixel with $\theta < 0$. The fat/water separation is performed using Equations 2 and 3. The entire process is repeated N times, each time adding a fixed phase offset to the input phase image. For example, the process could be repeated six times with phase offsets of 0, 30, 60, 90, 120 and 150 degrees. The number of phase offsets and their increments is essentially arbitrary. Fat and water images are generated for each phase offset (as shown in FIG. 8). The effect of the phase offset is to shift the position of the positive/negative polarity junction in the input signed magnitude data. The fat/water output values of the SVD solution will remain the same for all pixels, except those near the junction. The most common value (mode) of the total set is assigned as the value in the final fat/water image. An example implementation of the algorithm is displayed in FIG. 8 where, in this example, three phase offsets are used. The output fat/water images of each phase offset are combined using a mode operation to create the final fat/water images.

The relative RF transmit phase of the RF components in the WFOP-prep prepulse can be adjusted to generate different fat/water sinusoidal responses. Multiple images at different relative RF transmit phases can be combined to create a Dixon image with a robust off-resonance response.

It is not strictly necessary that the RF components have different transmit phases. If they have the same transmit phase (i.e., +x, +x), it would produce negative water and positive fat, but would still work. Thus, the components are independently phased, which encompasses the ability to be different, but not necessarily so.

Alternative embodiments discussed in the just prior two paragraphs can be combined to produce fat/water separation images with a robust off-resonance response.

The number of RF pulses and/or components in the WFOP-prep module can be modified. For example, a 1:3:3:1 composite binomial RF pulse can be used. Different binomial schemes (1:1, 1:2:1, 1:3:3:1, etc.) will yield different off-resonance response shapes. In general, the more component pulses in the composite binomial pulse, the closer the response will come to resemble a boxcar shape. The 1:1 example offers the simplest response shape (sinusoidal) and thus is a presently preferred choice.

A simple fat/water in-phase image can be acquired by acquiring one image set with WFOP-prep completely absent (this would be a conventional MR image). It can be combined with other WFOP-prep enabled scans for fat/water separation. Although it is possible, this embodiment has the distinct disadvantage of mixing data with $\Delta B_1 / \Delta B_0$ effects (the WFOP data) with data without these effects (the conventional MR image). Thus, the fat/water separation quality is expected to suffer in this embodiment.

WFOP-prep enables Dixon imaging without restrictions on pulse sequence timing (TE/TR, inter-echo spacing, readout bandwidth, etc.). Therefore, it can be used in conjunction with aggressive readout methods (i.e., short echo-space FSE and short TE SSFP) which have been previously difficult or impossible to use for Dixon imaging.

The WFOP-prep sequence is insensitive to time-dependent sources of background phase including eddy currents, which confound conventional Dixon fat/water separation methods (IDEAL).

The WFOP-prep can use fast, straightforward processing with simple magnitude and phase image input. Unlike other methods, there is no need for sophisticated phase unwrapping, background phase removal, or homodyne processing.

Like all Dixon-based methods, WFOP-prep requires a minimum of two input images for full separation Dixon water/fat images. However, the input images cannot be acquired in the same main data acquisition sequence, as they could be with a multi-echo gradient echo readout method. Therefore, WFOP-prep may not be a good substitute for multi-echo gradient echo imaging (i.e., LAVA).

Furthermore, WFOP-prep potentially suffers from signal loss due to off-resonance. To mitigate this signal loss, additional images with RF transmit phase cycling may be preferred or needed.

WFOP-prep requires flip-down and flip-up RF pulses to transition the magnetization to and from the transverse plane (where phase evolution occurs). Therefore, WFOP-prep can be sensitive to $B_1$ RF inhomogeneity. If the initial flip down RF pulse with flip angle a is not truly 90°, some magnetization will remain in the longitudinal axis ($\cos \alpha$). After the phase evolution period, the transverse magnetization may be flipped back up into the longitudinal axis with the same flip angle $\alpha$. The final longitudinal magnetization then will be a combination of phase-evolved magnetization (modulated by a factor of $\sin^2 \alpha$) and un-phase-evolved (modulated by a factor of $\cos^2 \alpha$). The mixing of evolved and un-evolved magnetization disrupts fat/water separation processing. For pixels with nearly 100% fat or water ($\rho_w>0.9$ or $\rho_f>0.9$), large deviations ($\alpha<70°$ or $\alpha>110°$, roughly 20% $\Delta B_1$) may cause incorrect assignments of fat/water pixel values.

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) process which generates images of patient tissue and comprises use of at least one programmed controller in an MRI system to effect:
   (a) a preparatory nuclear magnetic resonance (NMR) sequence comprising a binomial radio frequency (RF) pulse having at least two independently phased RF flip angle components, said components being spaced in the time domain by τ to provide a respectively corresponding evolved phase difference Δθ between predetermined NMR species which have different NMR frequencies;
   (b) a main MRI data acquisition sequence following said preparatory NMR sequence; and
   (c) generation and display of an image of said patient tissue based at least in part on MRI data acquired during said acquisition sequence.

2. An MRI process as in claim 1, wherein said preparatory sequence comprises at least one magnetic gradient spoiler pulse after said at least one binomial RF pulse.

3. An MRI process as in claim 1, wherein the sum of said RF flip angle components provides a substantially 180° nutation flip angle.

4. An MRI process as in claim 1, wherein said RF flip angle components comprise two RF components which have independent RF transmit phase.

5. An MRI process as in claim 1, wherein said evolved phase difference Δθ is substantially 180°.

6. An MRI process as in claim 1, wherein:
   (i) the sum of said RF flip angle components provides a substantially 180° nutation flip angle;
   (ii) said RF flip angle components comprise two RF components which have independent RF transmit phase; and
   (iii) said evolved phase difference is substantially 180°.

7. An MRI process as in claim 6, wherein said predetermined NMR species comprise water and fat species having an NMR chemical phase shift separation of about 3.4 parts per million.

8. An MRI process as in claim 1, further comprising repetition of steps (a) and (b) with phase cycling of the relative transmit phases used for at least one of said binomial pulse components followed by combination of the acquired MRI data resulting from said phase cycling before step (c).

9. An MRI process as in claim 8, wherein said combination of the acquired MRI data produces a more uniform signal across a spectrum of off-resonances and thus a more uniform final image by using at least one of: (i) sum of squares (SSQ) and (ii) maximum intensity projection (MIP) calculations.

10. An MRI process as in claim 1, wherein step (b) comprises at least one of:
   a fast spin echo (FSE) MRI data acquisition sequence;
   a single-shot fast spin echo MRI data acquisition sequence;
   a fast asymmetric spin echo (FASE) MRI data acquisition sequence;
   a variable flip angle (VFA) MRI data acquisition sequence; and
   a steady-state free precession (SSFP) MRI data acquisition sequence.

11. A magnetic resonance imaging (MRI) system which generates images of patient tissue and comprises at least one programmed controller in an MRI system configured to effect:
   (a) a preparatory nuclear magnetic resonance (NMR) sequence comprising a binomial radio frequency (RF) pulse having at least two independently phased RF flip angle components, said components being spaced in the time domain by τ to provide a respectively corresponding evolved phase difference Δθ between predetermined NMR species which have different NMR frequencies and followed by at least one magnetic gradient spoiler pulse;
   (b) a main MRI data acquisition sequence following said preparatory NMR sequence; and
   (c) generation and display of an image of said patient tissue based at least in part on MRI data acquired during said acquisition sequence.

12. An MRI system as in claim 11, wherein said preparatory sequence comprises at least one magnetic gradient spoiler pulse after said at least one binomial RF pulse.

13. An MRI system as in claim 11, wherein the sum of said RF flip angle components provides a substantially 180° nutation flip angle.

14. An MRI system as in claim 11, wherein said RF flip angle components comprise two RF components which have independent RF transmit phase.

15. An MRI system as in claim 11, wherein said evolved phase difference Δθ is substantially 180°.

16. An MRI system as in claim 11, wherein:
   (i) the sum of said RF flip angle components provides a substantially 180° nutation flip angle;
   (ii) said RF flip angle components comprise two RF components which have independent RF transmit phase; and
   (iii) said evolved phase difference is substantially 180°.

17. An MRI system as in claim 16, wherein said predetermined NMR species comprise water and fat species having an NMR chemical phase shift separation of about 3.4 parts per million.

18. An MRI system as in claim 11, further comprising repetition of steps (a) and (b) with phase cycling of the relative phases used for at least one of said binomial pulse components followed by combination of the acquired MRI data resulting from said phase cycling before step (c).

19. An MRI process as in claim 18, wherein said combination of the acquired MRI data produces a more uniform signal across a spectrum of off-resonances and thus a more uniform final image by using at least one of: (i) sum of squares (SSQ) and (ii) maximum intensity projection (MIP) calculations.

20. An MRI process as in claim 11, wherein step (b) comprises at least one of:

a fast spin echo (FSE) MRI data acquisition sequence;

a single-shot fast spin echo MRI data acquisition sequence;

a fast asymmetric spin echo (FASE) MRI data acquisition sequence;

a variable flip angle (VFA) MRI data acquisition sequence; and a steady-state free precession (SSFP) MRI data acquisition sequence.

* * * * *